United States Patent
Ogino et al.

(10) Patent No.: US 11,866,676 B2
(45) Date of Patent: Jan. 9, 2024

(54) CLEANING AGENT COMPOSITION AND CLEANING METHOD

(71) Applicant: NISSAN CHEMICAL CORPORATION, Tokyo (JP)

(72) Inventors: Hiroshi Ogino, Toyama (JP); Tetsuya Shinjo, Toyama (JP); Ryo Karasawa, Toyama (JP); Takahisa Okuno, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 182 days.

(21) Appl. No.: 17/430,962

(22) PCT Filed: Feb. 14, 2020

(86) PCT No.: PCT/JP2020/005808
§ 371 (c)(1),
(2) Date: Aug. 13, 2021

(87) PCT Pub. No.: WO2020/166702
PCT Pub. Date: Aug. 20, 2020

(65) Prior Publication Data
US 2022/0145218 A1 May 12, 2022

(30) Foreign Application Priority Data
Feb. 15, 2019 (JP) .................... 2019-026052

(51) Int. Cl.
| | | |
|---|---|---|
| C11D 7/50 | (2006.01) | |
| C11D 3/30 | (2006.01) | |
| C09J 7/30 | (2018.01) | |
| C11D 3/24 | (2006.01) | |
| C11D 3/28 | (2006.01) | |
| C11D 3/43 | (2006.01) | |
| C11D 11/00 | (2006.01) | |
| H01L 21/02 | (2006.01) | |

(52) U.S. Cl.
CPC ................... *C11D 3/30* (2013.01); *C09J 7/30* (2018.01); *C11D 3/245* (2013.01); *C11D 3/28* (2013.01); *C11D 3/43* (2013.01); *C11D 11/0047* (2013.01); *H01L 21/02057* (2013.01); *C09J 2483/00* (2013.01)

(58) Field of Classification Search
CPC .................................. C11D 11/0047

USPC .......................................................... 510/175
See application file for complete search history.

(56) References Cited

U.S. PATENT DOCUMENTS

| | | | |
|---|---|---|---|
| 6,818,608 B2 | 11/2004 | Moore | |
| 2006/0014656 A1* | 1/2006 | Egbe ..................... | C11D 7/263 |
| | | | 257/E21.255 |
| 2014/0336093 A1 | 11/2014 | Koellnberger | |
| 2017/0158888 A1 | 6/2017 | Kang et al. | |
| 2021/0317390 A1* | 10/2021 | Nakazaki ............. | C11D 7/5022 |

FOREIGN PATENT DOCUMENTS

| | | |
|---|---|---|
| JP | 2006-9006 A | 1/2006 |
| JP | 2007-109744 A | 4/2007 |
| JP | 2008-274214 A | 11/2008 |
| JP | 2015-505886 A | 2/2015 |
| KR | 10-2016-0087089 A | 7/2016 |
| WO | WO 2014/092022 A1 | 6/2014 |

OTHER PUBLICATIONS

Office Action for JP App. No. 2020-572337, dated Sep. 21, 2022 (w/ translation).
ISR for PCT/JP2020/005808, dated Mar. 24, 2020 (w/ translation).
Written Opinion for PCT/JP2020/005808, dated Mar. 24, 2020.

* cited by examiner

*Primary Examiner* — Gregory E Webb
(74) *Attorney, Agent, or Firm* — Greenblum & Bernstein, P.L.C.

(57) ABSTRACT

A cleaning agent composition for use in removal of a polysiloxane adhesive remaining on a substrate, the composition containing a tetrahydrocarbylammonium fluoride and an organic solvent, wherein the organic solvent contains an alkylene glycol dialkyl ether and a lactam compound represented by formula (1).

[F1]

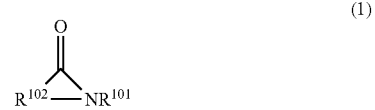

(1)

(in formula (1), $R^{101}$ represents a C1 to C6 alkyl group, and $R^{102}$ represents a C1 to C6 alkylene group.)

13 Claims, No Drawings

CLEANING AGENT COMPOSITION AND CLEANING METHOD

TECHNICAL FIELD

The present invention relates to a cleaning agent composition for use in removal of an adhesive residue remaining after, for example, debonding a laminate which has been temporarily bonded by the mediation of an adhesive layer formed from a polysiloxane adhesive and on a semiconductor substrate. The invention also relates to a cleaning method making use of the adhesive agent composition.

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing. For example, one required performance includes having high stress (i.e., strong adhesion) within the plane during polishing and low stress (i.e., weak adhesion) toward the thickness direction during detaching. Furthermore, in processing steps, the temperature of a workpiece may exceed 150° C. in some cases. Thus, temporary bonding must be stable at such high temperatures.

Under such circumstances, polysiloxane adhesives meeting the aforementioned characteristic requirements are mainly used as temporary adhesives in the semiconductor industry. In temporary bonding by use of a polysiloxane adhesive, an adhesive residue often remains on a substrate surface after removal of the thinned substrate. In order to avoid an undesired phenomenon in a subsequent step, there has been developed a cleaning agent composition for removing such a residue and cleaning the surface of a semiconductor substrate (see, for example, Patent Documents 1 and 2). Currently, there is continuous demand for a new cleaning agent composition in the semiconductor field. Patent Document 1 discloses a siloxane resin-remover containing a polar, aprotic solvent and a quaternary ammonium hydroxide, and Patent Document 2 discloses a cured resin-remover containing an alkylammonium fluoride. However, development of a more effective cleaning agent composition is expected.

PRIOR ART DOCUMENTS

Patent Documents

Patent Document 1: WO 2014/092022
Patent Document 2: U.S. Pat. No. 6,818,608

SUMMARY OF THE INVENTION

Problems to be Solved by the Invention

The present invention has been conceived in view of the foregoing. Thus, an object of the invention is to provide a cleaning agent composition which has excellent cleaning performance, in cleaning of a substrate (e.g., a semiconductor substrate), with respect to an adhesive residue remaining after debonding a laminate that has been temporarily bonded by the mediation of an adhesive layer formed from a polysiloxane adhesive and on a semiconductor substrate and which can clean the substrate at high efficiency without corroding the substrate. Another object is to provide a cleaning method using the composition.

Means for Solving the Problem

The present inventors have conducted extensive studies to attain the aforementioned objects, and have found the following. In cleaning of a substrate (e.g., a semiconductor substrate) on which an adhesive residue remains after debonding a laminate that has been temporarily bonded by the mediation of an adhesive layer formed from a polysiloxane adhesive, the substrate can be suitably cleaned at high efficiency in a short period of time without corroding the substrate, by use of a cleaning agent composition containing a tetrahydrocarbylammonium fluoride and an organic solvent, wherein the organic solvent contains an alkylene glycol dialkyl ether and a lactam compound represented by formula (1). The present invention has been accomplished on the basis of this finding.

Notably, neither Patent Document 1 nor 2 teaches or suggests a specific technical feature of the cleaning agent composition of the present invention.

Accordingly, the present invention provides the following.

1. A cleaning agent composition for use in removal of a polysiloxane adhesive remaining on a substrate, characterized in that the composition comprises a tetrahydrocarbylammonium fluoride and an organic solvent, wherein the organic solvent contains an alkylene glycol dialkyl ether and a lactam compound represented by formula (1):

[F1]

(wherein $R^{101}$ represents a C1 to C6 alkyl group, and $R^{102}$ represents a C1 to C6 alkylene group).

2. A cleaning agent composition according to 1 above, wherein the lactam compound includes at least one member selected from N-methyl-2-pyrrolidone and N-ethyl-2-pyrrolidone.

3. A cleaning agent composition according to 1 or 2 above, wherein the alkylene glycol dialkyl ether includes at least one member selected from among ethylene glycol dimethyl ether, ethylene glycol diethyl ether, ethylene glycol dipropylethane, ethylene glycol dibutyl ether, propylene glycol dimethyl ether, propylene glycol diethyl ether, and propylene glycol dipropyl ether.

4. A cleaning agent composition according to any of 1 to 3 above, wherein the tetrahydrocarbylammonium fluoride includes at least one member selected from among tetramethylammonium fluoride, tetraethylammonium fluoride, tetrapropylammonium fluoride, and tetrabutylammonium fluoride.

5. A cleaning agent composition according to any of 1 to 4 above, wherein the ratio by mass of the alkylene glycol dialkyl ether to the lactam compound (alkylene glycol dialkyl ether:lactam compound) is 30:70 to 80:20.

6. A cleaning agent composition according to 1 above, wherein the lactam compound includes at least one member selected from N-methyl-2-pyrrolidone and N-ethyl-2-pyrrolidone; the alkylene glycol dialkyl ether includes at least one member selected from among ethylene glycol dimethyl ether, ethylene glycol diethyl ether, ethylene glycol dipropylethane, ethylene glycol dibutyl ether, propylene glycol dimethyl ether, propylene glycol diethyl ether, and propylene glycol dipropyl ether; and the tetrahydrocarbylammonium fluoride includes at least one member selected from among tetramethylammonium fluoride, tetraethylammonium fluoride, tetrapropylammonium fluoride, and tetrabutylammonium fluoride.

7. A cleaning agent composition according to 6 above, wherein the ratio by mass of the alkylene glycol dialkyl ether to the lactam compound (alkylene glycol dialkyl ether lactam compound) is 30:70 to 80:20.

8. A cleaning agent composition according to any of 1 to 7 above, wherein the polysiloxane adhesive remaining on a substrate is an adhesive residue originating from an adhesive layer formed from an adhesive composition containing a component (A) which is cured through hydrosilylation.

9. A cleaning method, characterized by comprising removing an adhesive residue remaining on a substrate by use of a cleaning agent composition as recited in any of 1 to 8 above.

10. A method for producing a processed semiconductor substrate, the method comprising a first step of producing a laminate including a semiconductor substrate, a support substrate, and an adhesive layer formed from an adhesive composition; a second step of processing the semiconductor substrate of the produced laminate; a third step of debonding the semiconductor substrate after processing; and a fourth step of removing an adhesive residue remaining on the debonded semiconductor substrate with a cleaning agent composition, characterized in that a cleaning agent composition as recited in any of 1 to 8 above is used as the cleaning agent composition.

Effects of the Invention

According to the cleaning agent composition of the present invention, a substrate (e.g., a semiconductor substrate) on which an adhesive residue remains after debonding a laminate which has been temporarily bonded by the mediation of an adhesive layer formed from a polysiloxane adhesive can be cleaned at high efficiency in a short period of time without corroding the substrate.

MODES FOR CARRYING OUT THE INVENTION

The present invention will next be described in more detail.

The cleaning agent composition of the present invention is directed to a cleaning agent composition for use in removal of a polysiloxane adhesive remaining on a substrate (e.g., a semiconductor substrate), and the composition contains a tetrahydrocarbylammonium fluoride and an organic solvent, wherein the organic solvent contains an alkylene glycol dialkyl ether and a lactam compound represented by formula (1):

[F2]

(1)

(wherein $R^{101}$ represents a C1 to C6 alkyl group, and $R^{102}$ represents a C1 to C6 alkylene group).

Specific examples of the hydrocarbyl group of the tetrahydrocarbylammonium fluoride include a C1 to C20 alkyl group, a C2 to C20 alkenyl group, a C2 to C20 alkynyl group, and a C6 to C20 aryl group.

In one preferred embodiment of the present invention, the tetrahydrocarbylammonium fluoride includes tetraalkylammonium fluoride.

Specific examples of the tetraalkylammonium fluoride include, but are not limited to, tetramethylammonium fluoride, tetraethylammonium fluoride, tetrapropylammonium fluoride, and tetrabutylammonium fluoride. Of these, tetrabutylammonium fluoride is preferred.

Notably, a tetrahydrocarbylammonium fluoride hydrate may be used. Also, these tetrahydrocarbylammonium fluorides may be used singly or in combination of two or more species.

No particular limitation is imposed on the amount of the tetrahydrocarbylammonium fluoride, so long as it can be dissolved in the solvent contained in the cleaning agent composition. The amount is generally 0.1 to 30 mass % based on the amount of the cleaning agent composition.

Specific examples of the alkylene glycol dialkyl ether include, but are not limited to, ethylene glycol dimethyl ether (may also be referred to as dimethoxyethane), ethylene glycol diethyl ether (may also be referred to as diethoxyethane), ethylene glycol dipropylethane (may also be referred to as dipropoxyethane), ethylene glycol dibutyl ether (may also be referred to as dibutoxyethane), propylene glycol dimethyl ether (may also be referred to as dimethoxypropane), propylene glycol diethyl ether (may also be referred to as diethoxypropane), and propylene glycol dipropyl ether (may also be referred to as dipropoxypropane) Also, these alkylene glycol dialkyl ethers may be used singly or in combination of two or more species.

The amount of the alkylene glycol dialkyl ether is 1 to 98.9 mass % based on the amount of the cleaning agent composition.

Specific examples of the C1 to C6 alkyl group in formula (1) include, but are not limited to, methyl, ethyl, n-propyl, and n-butyl. Specific examples of the C1 to C6 alkylene group in formula (1) include, but are not limited to, methylene, ethylene, trimethylene, tetramethylene, pentamethylene, and hexamethylene.

Specific examples of the lactam compound represented by formula (1) include an α-lactam compound, a β-lactam compound, a γ-lactam compound, and a δ-lactam compound. These lactam compounds may be used singly or in combination of two or more species.

In one preferred embodiment of the present invention, the lactam compound represented by formula (1) includes a 1-alkyl-2-pyrrolidone (N-alkyl-γ-butyrolactam). In a more preferred embodiment, the lactam compound includes N-methylpyrrolidone (NMP) or N-ethylpyrrolidone (NEP). In a still more preferred embodiment, the lactam compound includes N-methylpyrrolidone (NMP).

The amount of the lactam compound represented by formula (1) is generally 1 to 98.9 mass % based on the amount of the cleaning agent composition.

The ratio (by mass) of the alkylene glycol dialkyl ether to the lactam compound represented by formula (1) may be tuned to any value. Preferably, the ratio (alkylene glycol dialkyl ether:lactam compound represented by formula (1)) is 30:70 to 80:20, more preferably 35:65 to 76:24, still more preferably 40:60 to 73:27, yet more preferably 45:55 to 70:30.

In the present invention, the solvent used in the cleaning agent composition is limited to an organic solvent, whereby metallic contamination, metallic corrosion, etc. attributable to water are suppressed, to thereby suitably clean a substrate at high reproducibility. Thus, the cleaning agent composition of the present invention generally contains only an organic solvent as a solvent. As used herein, the expression "only an organic solvent" refers to the intended component of the solvent being formed of only an organic solvent, and does not exclude the presence of water unavoidably contained in the organic solvent and in other components.

In one preferred embodiment of the present invention, the organic solvent of the cleaning agent composition of the present invention consists of the alkylene glycol dialkyl ether and the lactam compound represented by formula (1).

In the present invention, the tetrahydrocarbylammonium fluoride is dissolved in the solvent contained in the cleaning agent composition.

The cleaning agent composition of the present invention is prepared by mixing the tetrahydrocarbylammonium fluoride, the alkylene glycol dialkyl ether, the lactam compound represented by formula (1), and other optional components. These ingredients may be mixed in any chronological order, so long as problematic phenomena impeding the attainment of the objects of the present invention (e.g., precipitation and liquid phase separation) do not occur. That is, a part of the ingredients of the cleaning agent composition may be mixed in advance, followed by mixing of the other ingredients. Alternatively, all the ingredients may be mixed through a single mixing operation. If required, the cleaning agent composition may be filtered. Further, in the case where a certain ingredient has hygroscopicity, deliquescency, or the like, the entire or a part of the steps of preparing the cleaning agent composition may be conducted under inert gas.

The above-described cleaning agent composition of the present invention exerts excellent cleansability to a polysiloxane adhesive and attains a high cleaning speed and an excellent cleaning persistency.

Specifically, the cleaning speed is determined as an etching rate [μm/min], which is determined by measuring a decrease in the layer (film) thickness of an adhesive layer obtained from an adhesive composition of interest after contact with the cleaning agent composition of the present invention for 5 minutes at room temperature (23° C.) and dividing the decrease in the layer thickness by the time required for cleaning. The etching rate is generally 5.0 [μm/min] or greater, 7.0 [μm/min] or greater in a preferred embodiment, 7.5 [μm/min] or greater in a more preferred embodiment, 8.0 [μm/min] or greater in a still more preferred embodiment, and 9.0 [μm/min] or greater in a yet more preferred embodiment.

The cleaning persistency of the cleaning agent composition of the present invention is assessed by the time for dissolving 1 g of an adhesive solid obtained from an adhesive composition through contact with the cleaning agent composition (2 g) at room temperature (23° C.). The cleaning persistency is generally 12 to 24 hours for substantial dissolution of the adhesive solid, 2 to 12 hours for complete dissolution of the adhesive solid in a preferred embodiment, and 1 to 2 hours for complete dissolution of the adhesive solid in a more preferred embodiment.

According to the present invention, a polysiloxane adhesive remaining on a substrate (e.g., a semiconductor substrate) is removed by use of the above-described cleaning agent composition, whereby the substrate can be cleaned in a short period of time. Thus, high-efficiency (favorable) cleaning of a substrate (e.g., a semiconductor substrate) can be achieved.

The cleaning agent composition of the present invention is used for surface-cleaning of various substrates including semiconductor substrates. The cleaning target is not limited to a silicon semiconductor substrate, and various substrates may be cleaned. Examples of such substrates (cleaning targets) include a germanium substrate, a gallium arsenide substrate, a gallium phosphide substrate, a gallium aluminum arsenide substrate, an aluminum-plated silicon substrate, a copper-plated silicon substrate, a silver-plated silicon substrate, a gold-plated silicon substrate, a titanium-plated silicon substrate, a silicon nitride film-coated silicon substrate, a silicon oxide film-coated silicon substrate, a polyimide film-coated silicon substrate, a glass substrate, a quartz substrate, a liquid crystal substrate, and an organic EL substrate.

One suitable mode of use of the cleaning agent composition of the present invention in semiconductor processing is use thereof in a method for producing a thinned substrate employed in semiconductor packaging techniques such as TSV.

More specifically, the cleaning agent composition of the present invention is used as a cleaning agent composition in a production method including a first step of producing a laminate including a semiconductor substrate, a support substrate, and an adhesive layer formed from an adhesive composition; a second step of processing the semiconductor substrate of the produced laminate; a third step of debonding the semiconductor substrate after processing; and a fourth step of removing an adhesive residue remaining on the debonded semiconductor substrate with a cleaning agent composition.

Typically, the adhesive composition used in the first step for forming an adhesive layer may be at least one species selected from among a silicone adhesive, an acrylic resin adhesive, an epoxy resin adhesive, a polyamide adhesive, a polystyrene adhesive, a polyimide adhesive, and a phenolic resin adhesive. Particularly for removing a polysiloxane adhesive, the cleaning agent composition of the present invention is effectively used. Among polysiloxane adhesives, the cleaning agent composition of the present invention is effective for removing a residue originating from a polysiloxane adhesive containing a component (A) which is cured through hydrosilylation.

Thus, next will be described a method for producing a thinned substrate by use of a polysiloxane adhesive (adhesive composition) containing a component (A) which is cured through hydrosilylation, and the cleaning agent composition of the present invention. However, needless to say, the present invention is not limited to the production method.

Firstly, there will be described the first step of producing a laminate including a semiconductor substrate, a support substrate, and an adhesive layer formed from an adhesive composition.

The component (A) which is contained in the adhesive composition and which is cured through hydrosilylation contains, for example, a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. However, a linear-chain alkyl group and a branched-chain alkyl group are preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cyclic alkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) are generally 500 to 1,000,000, preferably 5,000 to 50,000.

Meanwhile, weight average molecular weight may be determined by means of, for example, a GPC apparatus (EcoSEC, HLC-8320GPC, products of Tosoh Corporation) and GPC columns (Shodex(registered trademark), KF-803L, KF-802, and KF-801, products of Showa Denko K.K.) at a column temperature of 40° C. and a flow rate of 1.0 mL/min by use of tetrahydrofuran as an eluent (extraction solvent) and polystyrene (product of Sigma-Aldrich) as a standard substance.

The polyorganosiloxane (a1) and the polyorganosiloxane (a2) contained in the adhesive composition react with each other via hydrosilylation, to thereby form a cured film. Thus, the curing mechanism differs from the mechanism of curing mediated by, for example, silanol groups. Therefore, neither of the siloxanes of the present invention is required to have a silanol group or a functional group forming a silanol group through hydrolysis (e.g., an alkyloxy group).

The component (A) contains the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

The component (A) may contain a polymerization inhibitor (A3). Through incorporation of the polymerization inhibitor into the adhesive composition, heat curing during bonding can be suitably controlled, whereby an adhesive composition which can provide an adhesive layer having an excellent bonding/debonding property can be produced at high reproducibility.

No particular limitation is imposed on the polymerization inhibitor, so long as it can suppress the progress of hydrosilylation. Specific examples of the polymerization inhibitor include, but are not limited to, optionally aryl group-substituted alkynylalkyl alcohols such as 1-ethynyl-1-cyclohexanol and 1,1-diphenyl-2-propyn-1-ol.

Generally, the amount of polymerization inhibitor with respect to the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition may contain a component (B) containing at least one species selected from the group consisting of a component containing an epoxy-modified polyorganosiloxane, a component containing a methyl-group-containing polyorganosiloxane, and a component containing a phenyl-group-containing polyorganosiloxane. Through incorporation of such a component (B) into the adhesive composition, the formed adhesive layer can be suitably peeled off at high reproducibility.

The epoxy-modified polyorganosiloxane includes, for example, such a siloxane containing a siloxane unit represented by $R^{210}R^{220}SiO_{2/2}$ (unit $D^{210}$), preferably a siloxane containing a siloxane unit represented by $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

Also, the epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-modified polyorganosiloxanes include, but are not limited to, epoxy-modified polydimethylsiloxane.

The epoxy-modified polyorganosiloxane contains the aforementioned siloxane unit (unit $D^{10}$), but may also contain the aforementioned unit Q, unit M and/or unit T, in addition to unit $D^{10}$.

In one preferred embodiment, specific examples of the epoxy-modified polyorganosiloxane include polyorganosiloxane formed only of unit $D^{10}$, polyorganosiloxane formed of unit $D^{10}$ and unit Q, polyorganosiloxane formed of unit $D^{11}$ and unit M, polyorganosiloxane formed of unit $D^{11}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-modified polyorganosiloxane is preferably an epoxy-modified polydimethylsiloxane having an epoxy value of 0.1 to 5. The weight average molecular weight thereof is generally 1,500 to 500,000, but preferably 100,000 or lower, for the purpose of suppression of deposition in the adhesive composition.

Specific examples of the epoxy-modified polyorganosiloxane include, but are not limited to, CMS-227 (product of Gelest Inc., weight average molecular weight: 27,000) represented by formula (A-1), ECMS-327 (product of Gelest Inc., weight average molecular weight: 28,800) represented by formula (A-2), KF-101 (product of Shin-Etsu Chemical Co., Ltd., weight average molecular weight: 31,800) represented by formula (A-3), KF-1001 (product of Shin-Etsu Chemical Co., Ltd., weight average molecular weight: 55,600) represented by formula (A-4), KF-1005 (product of Shin-Etsu Chemical Co., Ltd., weight average molecular weight: 11,500) represented by formula (A-5), X-22-343 (product of Shin-Etsu Chemical Co., Ltd., weight average molecular weight: 2,400) represented by formula (A-6), BY16-839 (product of Dow Corning, weight average molecular weight: 51,700) represented by formula (A-7), and ECMS-327 (product of Gelest Inc., weight average molecular weight: 28,800) represented by formula (A-8).

[F3]

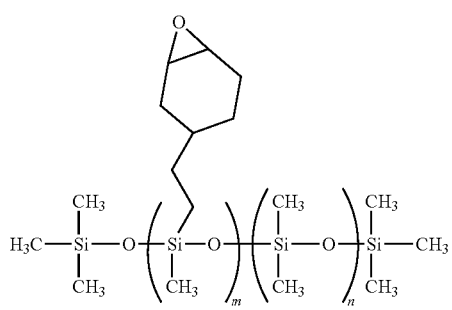

(A-1)

(Each of m and n represents the number of repeating units.)

[F4]

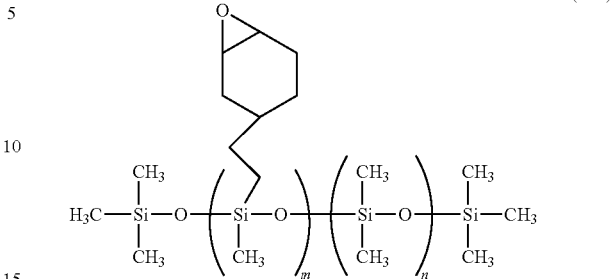

(A-2)

(Each of m and n represents the number of repeating units.)

[F5]

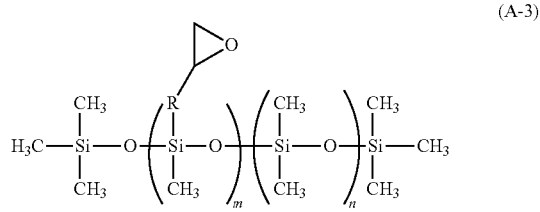

(A-3)

(Each of m and n represents the number of repeating units. R represents a C1 to C10 alkylene group.)

[F6]

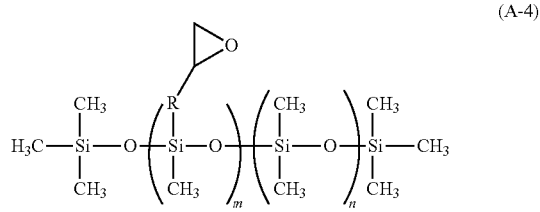

(A-4)

(Each of m and n represents the number of repeating units. R represents a C1 to C10 alkylene group.)

[F7]

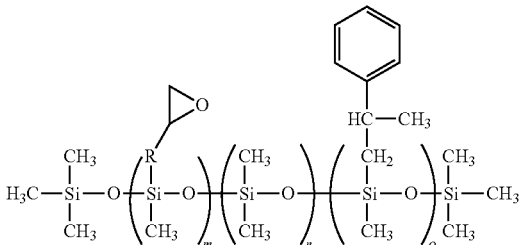

(A-5)

(Each of m, n and o represents the number of repeating units. R represents a C1 to C10 alkylene group.)

[F8]

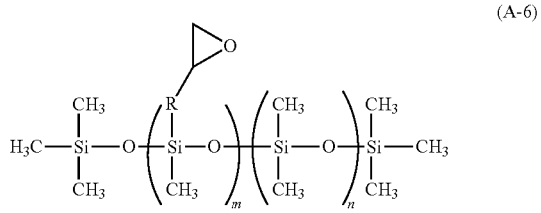

(A-6)

(Each of m and n represents the number of repeating units. R represents a C1 to C10 alkylene group.)

[F9]

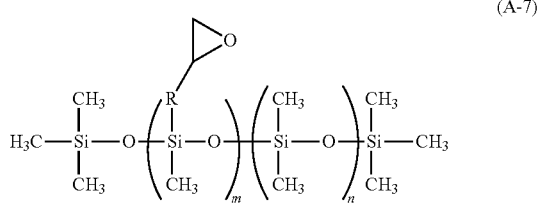

(A-7)

(Each of m and n represents the number of repeating units. R represents a C1 to C10 alkylene group.)

[F10]

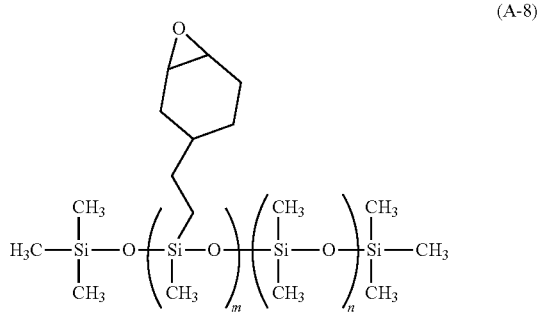

(A-8)

(Each of m and n represents the number of repeating units.)

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

Examples of preferred methyl-group-containing polyorganosiloxanes include, but are not limited to, polydimethylsiloxane.

The methyl-group-containing polyorganosiloxane contains the aforementioned siloxane unit (unit $D^{210}$ or unit $D^{20}$), but may also contain the aforementioned unit Q, unit M and/or unit T, in addition to unit $D^{200}$ or unit $D^{20}$.

In one embodiment, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

The viscosity of the methyl-group-containing polyorganosiloxane is generally 1,000 to 2,000,000 $mm^2/s$, preferably 10,000 to 1,000,000 $mm^2/s$. The methyl-group-containing polyorganosiloxane is typically dimethylsilicone oil formed of polydimethylsiloxane. The value of the viscosity is a kinematic viscosity (cSt (=$mm^2/s$)). The kinematic viscosity may be measured by means of a kinematic viscometer. Alternatively, the kinematic viscosity may also be calculated by dividing viscosity (mPa·s) by density (g/cm$^3$). In other words, the kinematic viscosity may be determined from a viscosity as measured at 25° C. by means of an E-type rotational viscometer and a density. The calculation formula is kinematic viscosity ($mm^2/s$)=viscosity (mPa·s)/density (g/cm$^3$).

Specific examples of the methyl-group-containing polyorganosiloxane include, but are not limited to, WACKER (registered trademark) SILICONE FLUID AK series (products of WACKER) and dimethylsilicone oils (KF-96L, KF-96A, KF-96, KF-96H, KF-69, KF-965, and KF-968) and cyclic dimethylsilicone oil (KF-995) (products of Shin-Etsu Chemical Co., Ltd.).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

The weight average molecular weight of the phenyl-group-containing polyorganosiloxane is generally 1,500 to 500,000, but preferably 100,000 or lower, for the purpose of suppression of deposition in the adhesive composition and for other reasons.

Specific examples of the phenyl-group-containing polyorganosiloxane include, but are not limited to, PMM-1043

(product of Gelest Inc., weight average molecular weight: 67,000, viscosity: 30,000 mm²/s) represented by formula (C-1), PMM-1025 (product of Gelest Inc., weight average molecular weight: 25,200, viscosity: 500 mm²/s) represented by formula (C-2), KF50-3000CS (product of Shin-Etsu Chemical Co., Ltd., weight average molecular weight: 39,400, viscosity: 3,000 mm²/s) represented by formula (C-3), TSF431 (product of MOMENTIVE, weight average molecular weight: 1,800, viscosity: 100 mm²/s) represented by formula (C-4), TSF433 (product of MOMENTIVE, weight average molecular weight: 3,000, viscosity: 450 mm²/s) represented by formula (C-5), PDM-0421 (product of Gelest Inc., weight average molecular weight: 6,200, viscosity: 100 mm²/s) represented by formula (C-6), and PDM-0821 (product of Gelest Inc., weight average molecular weight: 8,600, viscosity: 125 mm²/s) represented by formula (C-7).

[F11]

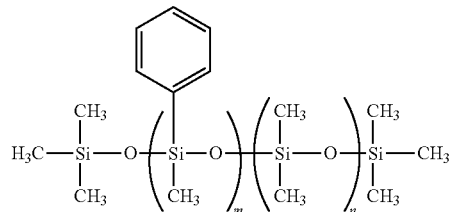

(C-1)

(Each of m and n represents the number of repeating units.)

[F12]

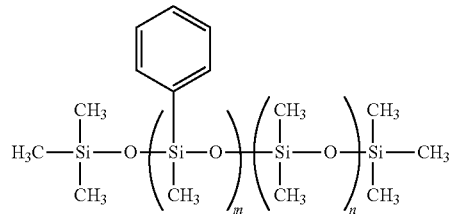

(C-2)

(Each of m and n represents the number of repeating units.)

[F13]

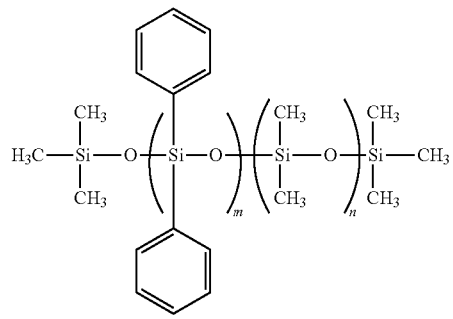

(C-3)

(Each of m and n represents the number of repeating units.)

[F14]

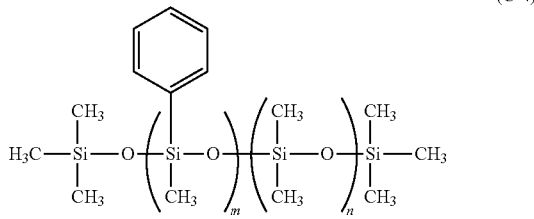

(C-4)

(Each of m and n represents the number of repeating units.)

[F15]

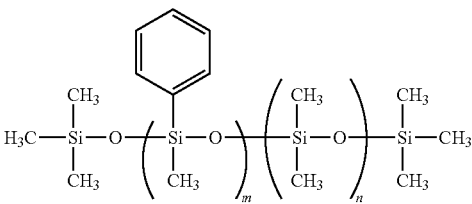

(C-5)

(Each of m and n represents the number of repeating units.)

[F16]

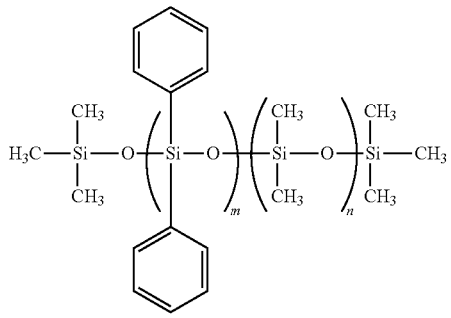

(C-6)

(Each of m and n represents the number of repeating units.)

[F17]

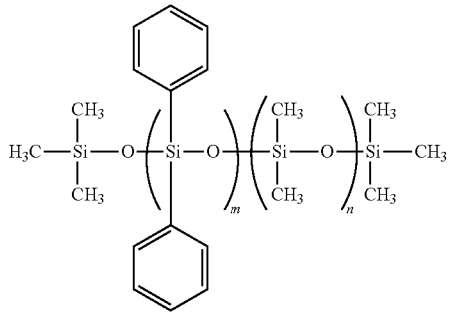

(C-7)

(Each of m and n represents the number of repeating units.)

The polysiloxane adhesive composition contains the components (A) and (B) at any compositional ratio. In consideration of the balance between bonding performance and debonding performance, the compositional ratio (mass %) of component (A) to component (B) is preferably 99.995:0.005 to 30:70, more preferably 99.9:0.1 to 75:25.

For the purpose of adjusting the viscosity or for other reasons, the adhesive composition may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition contains a solvent, the solvent content is appropriately adjusted in consideration of a target viscosity of the adhesive composition, the application method to be employed, the thickness of the formed thin film, etc. The solvent content of the entire composition is about 10 to about 90 mass %.

The adhesive composition generally has a viscosity (25° C.) of 500 to 20,000 mPa·s, preferably 1,000 to 5,000 mPa-s. The viscosity may be controlled by modifying the type and formulation of the organic solvent used, the film-forming component concentration, etc., in consideration of various factors such as the coating method employed and the target film thickness. Notably, the term "film-forming component" used in the present invention refers to any component other than solvent.

The adhesive composition used in the present invention may be produced by mixing film-forming components with solvent. However, in the case where no solvent is used, the adhesive composition used in the present invention may be produced by mixing film-forming components.

The first step specifically includes a primary step and a subsequent step. In the primary step, the adhesive composition is applied onto a surface of the semiconductor substrate or the support substrate, to thereby form an adhesive coating layer. In the subsequent step, the semiconductor substrate is adhered to the support substrate by the mediation of the adhesive coating layer, and a load is applied to the semiconductor substrate and the support substrate in a thickness direction, to thereby closely adhere the semiconductor substrate, the adhesive coating layer, and the support substrate, while at least one of a heat treatment and a reduced pressure treatment is performed. Then, a post-heat treatment is performed. Through the post-heat treatment in the subsequent step, the adhesive coating layer is suitably cured in a final stage to form an adhesive layer. Thus, a laminate is provided.

In one embodiment, the semiconductor substrate is a wafer, and the support substrate is a support. The adhesive composition may be applied to either of the semiconductor or support substrate, or both of the semiconductor and support substrates.

No particular limitation is imposed on the wafer, and an example of the wafer is a silicon wafer or a glass wafer having a diameter of about 300 mm and a thickness of about 770 μm.

No particular limitation is imposed on the support (carrier). Examples of the support include, but are not limited to, a silicon wafer having a diameter of about 300 mm and a thickness of about 700 μm.

The thickness of the aforementioned adhesive coating layer is generally 5 to 500 μm. However, the thickness is preferably 10 μm or greater, more preferably 20 μm or greater, still more preferably 30 μm or greater, from the viewpoint of maintaining the film strength, and it is preferably 200 μm or less, more preferably 150 μm or less, still more preferably 120 μm or less, yet more preferably 70 μm or less, from the viewpoint of avoiding variation in uniformity of the film thickness.

No particular limitation is imposed on the application method, and spin coating is generally employed. In an alternative method, a coating film is formed through spin coating or a similar technique, and the sheet-form coating film is attached. The concepts of the application method and the coating film of the invention also encompass the alternative method and coating film.

The heating temperature is generally 80° C. or higher, preferably 150° C. or lower, from the viewpoint of prevention of excessive curing. The time of heating is generally 30 seconds or longer, preferably 1 minute or longer, for securing temporary bonding performance. Also, the heating time is generally 10 minutes or shorter, preferably 5 minutes or shorter, from the viewpoint of suppressing deterioration of the adhesive layer and other members.

In the reduced pressure treatment, the two substrates and the adhesive coating layer disposed therebetween are placed in an atmosphere at 10 Pa to 10,000 Pa. The time of the reduced pressure treatment is generally 1 to 30 minutes.

In one preferred embodiment of the present invention, the two substrates and the adhesive coating layer disposed therebetween are bonded together preferably through a heat treatment, more preferably through a heat treatment in combination with a reduced pressure treatment.

No particular limitation is imposed on the load which is applied to the semiconductor substrate and the support substrate in a thickness direction, so long as the semiconductor substrate, the support substrate, and the layer therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of preventing deterioration of the substrates and the adhesives. The heating time is generally 1 minute or longer from the viewpoint of achieving suitable joining of a wafer through curing, preferably 5 minutes or longer from the viewpoint of, for example, stability in physical properties of the adhesives. Also, the heating time is generally 180 minutes or shorter, preferably 120 minutes or shorter, from the viewpoint of avoiding, for example, an adverse effect on the adhesive layers due to excessive heating. Heating may be performed by means of a hot plate, an oven, or the like. Notably, a purpose of performing post-heating is to, for example, more suitably cure the component (A).

There will next be described the second step for processing the semiconductor substrate of the laminate produced through the aforementioned method.

One example of the processing applied to the laminate used in the present invention is processing of a surface opposite the circuit-furnished surface of the semiconductor substrate. Typically, the processing is a thinning of a wafer by polishing (grinding) the backside thereof. Thereafter, through silicon vias (TSVs) and the like are formed by use of the thinned wafer, and the thinned wafer is removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The adhesive layer included in the laminate used in the present invention has heat resistance to the load.

In one specific embodiment, when the backside surface (a surface opposite the circuit-furnished surface) of a wafer having a diameter of about 300 mm and a thickness of about 770 µm is polished (ground), the thickness of the wafer can be reduced to about 80 µm to about 4 µm.

Next will be described the third step of debonding the semiconductor substrate formed of a semiconductor substrate after processing.

Examples of the laminate debonding method employed in the present invention include, but are not limited to, debonding with solvent, debonding with laser light, mechanical debonding by means of a machine member having a sharp part, and peeling between a support and a wafer. Generally, debonding is performed after processing (e.g., thinning).

In the third step, the adhesive is not always removed while the adhesive is firmly attached to the support substrate, and in some cases, a part of the adhesive may remain on the processed substrate. Thus, in the fourth step, the surface of the substrate on which the adhesive residue is attached is cleaned by use of the cleaning agent composition of the present invention. As a result, the adhesive remaining on the substrate can be satisfactorily removed.

Finally, the fourth step will be described. In the fourth step, the adhesive residue remaining on the debonded semiconductor substrate formed of a semiconductor substrate is removed by use of the cleaning agent composition.

The fourth step corresponds to removing the adhesive residue remaining on the debonded substrate by use of the cleaning agent composition of the present invention. In one specific procedure, a thinned substrate on which an adhesive remains is immersed in the cleaning agent composition of the present invention and, if required, subjected to ultrasonic cleaning or the like, to thereby remove the adhesive residue.

When ultrasonic cleaning is employed, the cleaning conditions are appropriately determined in consideration of the surface state of the substrate. Generally, through ultrasonic cleaning at 20 kHz to 5 MHz for 10 seconds to 30 minutes, the adhesive residue remaining on the substrate can be satisfactorily removed.

The method according to the present invention for producing a thinned substrate includes the aforementioned first to fourth steps, but may further include another step. For example, in the fourth step, before cleaning with the cleaning agent composition of the present invention, if required, the substrate may be immersed in various solvents, or subjected to tape peeling, to thereby remove the adhesive residue.

Notably, the aforementioned essential and claimed elements in the first to fourth steps may be modified in various ways, so long as the modifications do not deviate from the scope of the present invention.

EXAMPLES

The present invention will next be described in detail by way of Examples and Comparative Examples, which should not be construed as limiting the invention thereto. The apparatuses employed in the present invention are as follows.

(1) Agitator: Planetary centrifugal mixer ARE-500 (product of Thinky Corporation)
(2) Viscometer: Rotary viscometer TVE-22H (product of Toki Sangyo Co., Ltd)
(3) Agitator: Mix Roter Variable 1-1186-12 (product of As One Corporation)
(4) Agitator H: Heating Rocking Mixer HRM-1 (product of As One Corporation)
(5) Contact-type film thickness meter: Wafer thickness meter WT-425 (product of Tokyo Seimitsu Co., Ltd.)

[1] Preparation of Adhesive Compositions

Preparation Example 1

To a 600-mL agitation container dedicated for a planetary centrifugal mixer, there were added a base polymer formed of linear-chain polydimethylsiloxane having vinyl groups (viscosity: 200 mPa·s) and an MQ resin having vinyl groups (product of WACKER Chemie AG) (a1) (150 g), linear-chain polydimethylsiloxane having Si—H groups (viscosity: 100 mPa·s) (product of WACKER Chemie AG) (a2) (15.81 g), and 1-ethynyl-1-cyclohexanol (product of WACKER Chemie AG) (A3) (0.17 g), and the resultant mixture was agitated by means of a planetary centrifugal mixer for 5 minutes.

Separately, a platinum catalyst (product of WACKER Chemie AG) (A2) (0.33 g) and linear-chain polydimethylsiloxane having vinyl groups (viscosity: 1,000 mPa·s) (product of WACKER Chemie AG) (a1) (9.98 g) were added to a 50-mL screw tube, and the contents were agitated for 5 minutes by means of a planetary centrifugal mixer. A portion (0.52 g) of the thus-agitated mixture was added to the above mixture, and the resultant mixture was agitated for 5 minutes by means of a planetary centrifugal mixer. Finally, the product mixture was filtered through a nylon filter (300 mesh), to thereby prepare an adhesive composition having a viscosity of 9,900 mPa-s as determined by means of a rotary viscometer.

Preparation Example 2

To a 600-mL agitation container dedicated for a planetary centrifugal mixer, an MQ resin having vinyl groups (product of WACKER Chemie AG) (a1) (95 g), p-menthane (product of Nippon Terpene Chemicals, Inc.) (93.4 g) serving as a solvent, and 1,1-diphenyl-2-propyn-1-ol (product of Tokyo Chemical Industry Co., Ltd.) (0.41 g) were added, and the resultant mixture was agitated for 5 minutes by means of a planetary centrifugal mixer.

To the thus-prepared mixture, there were added linear-chain polydimethylsiloxane having Si—H groups (viscosity: 100 mPa·s) (product of WACKER Chemie AG) (a2), linear-chain polydimethylsiloxane having vinyl groups (viscosity: 200 mPa·s) (product of WACKER Chemie AG) (a1) (29.5 g), polyorganosiloxane (viscosity: 1,000,000 mm$^2$/s) (AK1000000, product of WACKER Chemie AG) (B), and 1-ethynyl-1-cyclohexanol (product of WACKER Chemie AG) (A3) (0.41 g), and the resultant mixture was further agitated for 5 minutes by means of a planetary centrifugal mixer.

Separately, a platinum catalyst (product of WACKER Chemie AG) (A2) (0.20 g) and linear-chain polydimethylsiloxane having vinyl groups (viscosity: 1,000 mPa·s) (product of WACKER Chemie AG) (a1) (17.7 g) were added to a 50-mL screw tube, and the contents were agitated for 5 minutes by means of a planetary centrifugal mixer. A portion (14.9 g) of the thus-agitated mixture was added to the above mixture, and the resultant mixture was further agitated for 5 minutes by means of the planetary centrifugal mixer. Finally, the product mixture was filtered through a nylon filter (300 mesh), to thereby prepare an adhesive composition having a viscosity of 4,600 mPa·s as determined by means of a rotary viscometer.

[2] Preparation of Cleaning Agent Compositions

Example 1

A solvent mixture of N-methyl-2-pyrrolidone (dehydrate) (product of Kanto Chemical Co., Inc.) (47.5 g) and 1,2-diethoxyethane (product of Tokyo Chemical Industry Co., Ltd.) (47.5 g) was added to tetrabutylammonium fluoride trihydrate (product of Kanto Chemical Co., Inc.) (5 g), and the thus-obtained mixture was agitated, to thereby prepare a cleaning agent composition.

Example 2

The procedure of Example 1 was repeated, except that the amounts of N-methyl-2-pyrrolidone (dehydrate) and 1,2-diethoxyethane were changed to 33 g and 62 g, respectively, to thereby prepare a cleaning agent composition.

Example 3

The procedure of Example 1 was repeated, except that the amounts of N-methyl-2-pyrrolidone (dehydrate) and 1,2-diethoxyethane were changed to 38 g and 57 g, respectively, to thereby prepare a cleaning agent composition.

Example 4

The procedure of Example 1 was repeated, except that the amounts of N-methyl-2-pyrrolidone (dehydrate) and 1,2-diethoxyethane were changed to 43 g and 52 g, respectively, to thereby prepare a cleaning agent composition.

Comparative Example 1

N-methyl-2-pyrrolidone (dehydrate) (95 g) was added to tetrabutylammonium fluoride trihydrate (5 g), and the thus-obtained mixture was agitated, to thereby prepare a cleaning agent composition.

Comparative Example 2

The procedure of Example 1 was repeated, except that diethylene glycol diethyl ether (product of Tokyo Chemical Industry Co., Ltd.) was used instead of 1,2-diethoxyethane, to thereby prepare a cleaning agent composition.

Comparative Example 3

The procedure of Example 1 was repeated, except that diethylene glycol dibutyl ether (product of Tokyo Chemical Industry Co., Ltd.) was used instead of 1,2-diethoxyethane, to thereby prepare a cleaning agent composition.

Comparative Example 4

The procedure of Example 1 was repeated, except that the solvent mixture was changed to 1,2-diethoxyethane (95 g), for preparing a cleaning agent composition. However, unsuccessfully, tetrabutylammonium fluoride trihydrate was not completely dissolved.

Comparative Example 5

A commercial silicone cleaner "KSR-1" (product of Kanto Chemical Co., Inc.) was used as a cleaning liquid composition.

[3] Evaluation of Performance of Cleaning Agent Compositions

Generally, the excellent cleaning agent composition is required to exhibit such a high cleaning speed that it can dissolve an adhesive residue immediately after contact therewith, and excellent persistency in cleaning speed. Thus, the following tests were performed. When a tested cleaning agent composition exhibits both higher cleaning speed and more excellent persistency in cleaning performance, more effective cleaning can be expected.

[3-1] Determination of Etching Rate

Each of the prepared cleaning agent compositions was evaluated in terms of cleaning speed by measuring the etching rate. Specifically, the adhesive composition obtained in Preparation Example 1 was applied onto a 12-inch silicon wafer by means of a spin coater so as to adjust the coating thickness to 100 µm, and cured at 150° C. for 15 minutes and 190° C. for 10 minutes. The thus-coated wafer was cut into square chips (4 cm×4 cm), and the layer (film) thickness of one of the chips was measured by means of a contact-type film thickness meter. Thereafter, the chip was placed in a 9-cm Petri dish made of stainless steel, and the cleaning agent composition (7 mL) was added, followed by closing the dish. The closed Petri dish was placed on Agitator H, and the chip was cleaned through agitation at 23° C. for 5 minutes. After cleaning, the chip was removed and washed with isopropanol and pure water, and then dry-baked at 150° C. for 1 minute. The layer (film) thickness of the chip was measured again by means of the contact-type film thickness meter. Through dividing the decrease in layer (film) thickness after cleaning by the cleaning time, etching rate [µm/min] was calculated. The etching rate was employed as an index for cleaning performance. Table 1 shows the results.

[3-2] Evaluation of Dissolution Property

For determining the persistency in cleaning performance of each of the prepared cleaning agent compositions, the following adhesive dissolution test was conducted. Specifically, the adhesive composition obtained in Preparation Example 2 was applied onto a 12-inch silicon wafer by means of a spin coater and cured at 120° C. for 1.5 minutes and 200° C. for 10 minutes. Subsequently, the cured adhesive composition was scraped off by use of a cutter blade from the 12-inch wafer. A portion (1 g) of the cured adhesive composition was transferred to and weighed in a 9-mL screw tube, and then the cleaning agent composition (2 g) was added to the tube. The dissolution state of the cured product was observed at 23° C. When the cured product was completely dissolved within 1 to 2 hours, the state was rated as "Excellent." When the cured product was completely dissolved within 2 to 12 hours, the state was rated as "Very good." When the cured product was substantially dissolved within 12 to 24 hours, the state was rated as "Good." When the cured product was substantially not dissolved over a long period of time, the state was rated as "Bad." Table 1 shows the results.

TABLE 1

| | Etching rate [µm/min] | Dissolution test |
|---|---|---|
| Ex. 1 | 9.4 | Excellent |
| Ex. 2 | 9.8 | Excellent |
| Ex. 3 | 10.0 | Excellent |
| Ex. 4 | 8.5 | Excellent |

TABLE 1-continued

| | Etching rate [μm/min] | Dissolution test |
|---|---|---|
| Comp. Ex. 1 | 5.1 | Bad |
| Comp. Ex. 2 | 6.6 | Bad |
| Comp. Ex. 3 | 5.0 | Very good |
| Comp. Ex. 5 | 2.3 | Bad |

As shown in Table 1, the cleaning agent compositions falling within the scope of the present invention, each containing an alkylene glycol dialkyl ether (1,2-diethoxyethane) and a specific lactam compound (N-methyl-2-pyrrolidone), were found to exhibit a higher etching rate and more excellent persistency in cleaning performance (i.e., excellent dissolution property), as compared with those of the cleaning agent composition of Comparative Example 1, containing only a lactam compound (N-methyl-2-pyrrolidone) as a solvent, and those of the cleaning agent compositions of Comparative Examples 2 and 3, containing a structurally similar glycol compound as a solvent.

[3-3] Evaluation of Corrosibility

A silicon wafer was immersed for 5 minutes in each of the cleaning agent compositions obtained in Examples 1 to 4. In all cases, no corrosion of the silicon wafer was observed.

The invention claimed is:

1. A cleaning agent composition for use in removal of a polysiloxane adhesive remaining on a substrate, the composition comprising:
   a tetrahydrocarbylammonium fluoride, and
   a solvent consisting of an organic solvent, wherein the organic solvent contains:
      a glycol compound, and
      a lactam compound represented by formula (1):

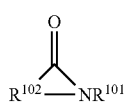

(1)

wherein:
   $R^{101}$ represents a C1 to C6 alkyl group, and
   $R^{102}$ represents a C1 to C6 alkylene group;
wherein:
   the organic solvent further contains an alkylene glycol dialkyl ether, and
   a ratio by mass of the alkylene glycol dialkyl ether to the lactam compound (alkylene glycol dialkyl ether:lactam compound) is 30:70 to 80:20.

2. The cleaning agent composition according to claim 1, wherein the lactam compound includes at least one member selected from N-methyl-2-pyrrolidone and N-ethyl-2-pyrrolidone.

3. The cleaning agent composition according to claim 1, wherein the organic solvent further contains a diethylene glycol diethyl ether or diethylene glycol dibutyl ether.

4. The cleaning agent composition according to claim 1, wherein the tetrahydrocarbylammonium fluoride includes at least one member selected from among tetramethylammonium fluoride, tetraethylammonium fluoride, tetrapropylammonium fluoride, and tetrabutylammonium fluoride.

5. The cleaning agent composition according to claim 1, wherein the alkylene glycol dialkyl ether includes at least one member selected from among ethylene glycol dimethyl ether, ethylene glycol diethyl ether, ethylene glycol dipropylethane, ethylene glycol dibutyl ether, propylene glycol dimethyl ether, propylene glycol diethyl ether, and propylene glycol dipropyl ether.

6. The cleaning agent composition according to claim 1, wherein the polysiloxane adhesive includes a component (A) which is cured through hydrosilylation.

7. The cleaning agent composition according to claim 6, wherein the component (A) contains a polysiloxane (Al) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) (each of $R^1$ to $R^6$ is a group or an atom bonded to a silicon atom and represents an alkyl group, an alkenyl group, or a hydrogen atom).

8. The cleaning agent composition according to claim 1, wherein a cleaning speed of the cleaning agent composition is 5.0 [μm/min] or greater; and the cleaning speed is determined as an etching rate [μm/min], which is determined by measuring a decrease in the layer (film) thickness of an adhesive layer obtained from an adhesive composition of interest after contact with the cleaning agent composition for 5 minutes at room temperature (23° C.) and dividing the decrease in the layer thickness by the time required for cleaning.

9. A cleaning method, comprising removing an adhesive residue remaining on a substrate using the cleaning agent composition according to claim 1.

10. A method for producing a processed semiconductor substrate, the method comprising:
    producing a laminate including a semiconductor substrate, a support substrate, and an adhesive layer formed from an adhesive composition;
    processing the semiconductor substrate of the produced laminate;
    debonding the semiconductor substrate after processing; and
    removing an adhesive residue remaining on the debonded semiconductor substrate with a cleaning agent composition,
    wherein the cleaning agent composition according to claim 1 is used as the cleaning agent composition.

11. A method for producing a cleaning agent composition for use in removal of a polysiloxane adhesive remaining on a substrate, the method comprising:
    mixing a tetrahydrocarbylammonium fluoride and a solvent consisting of an organic solvent under inert gas,
    wherein the organic solvent contains:
       a glycol compound, and
       a lactam compound represented by formula (1):

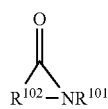

(1)

wherein:
   $R^{101}$ represents a C1 to C6 alkyl group, and
   $R^{102}$ represents a C1 to C6 alkylene group.

12. The method for producing a cleaning agent composition according to claim 11, wherein the organic solvent further contains a diethylene glycol diethyl ether or a diethylene glycol dibutyl ether.

13. The method for producing a cleaning agent composition according to claim 11, wherein a cleaning speed of the cleaning agent composition is 5.0 [μm/min] or greater; and the cleaning speed is determined as an etching rate [μm/min], which is determined by measuring a decrease in the layer (film) thickness of an adhesive layer obtained from an adhesive composition of interest after contact with the cleaning agent composition for 5 minutes at room temperature (23° C.) and dividing the decrease in the layer thickness by the time required for cleaning.

* * * * *